(12) United States Patent
Briatico et al.

(10) Patent No.: US 9,412,504 B2
(45) Date of Patent: Aug. 9, 2016

(54) VARISTOR

(71) Applicants: THALES, Courbevoie (FR); Centre National de la Recherche Scientifique, Paris (FR)

(72) Inventors: Javier Briatico, Palaiseau (FR); Javier Villegas, Palaiseau (FR); Rozenn Bernard, Palaiseau (FR)

(73) Assignees: THALES, Courbevoie (FR); CENTRE NATIONAL DE LA RECHERCHE SCIENTIFIQUE, Paris (FR)

( * ) Notice: Subject to any disclaimer, the term of this patent is extended or adjusted under 35 U.S.C. 154(b) by 0 days.

(21) Appl. No.: 14/649,887

(22) PCT Filed: Dec. 6, 2013

(86) PCT No.: PCT/EP2013/075840
§ 371 (c)(1),
(2) Date: Jun. 4, 2015

(87) PCT Pub. No.: WO2014/086990
PCT Pub. Date: Jun. 12, 2014

(65) Prior Publication Data
US 2015/0302956 A1    Oct. 22, 2015

(30) Foreign Application Priority Data
Dec. 7, 2012 (FR) .................................. 12 03321

(51) Int. Cl.
*H01B 12/00* (2006.01)
*H01C 7/10* (2006.01)
*G11C 11/22* (2006.01)
*G11C 11/44* (2006.01)
(Continued)

(52) U.S. Cl.
CPC *H01C 7/10* (2013.01); *G11C 11/22* (2013.01); *G11C 11/44* (2013.01); *G11C 11/54* (2013.01);
(Continued)

(58) Field of Classification Search
CPC ........ H01C 7/10; H01L 39/22; H01L 39/126; H01L 45/1233; G11C 11/22
USPC .......................................................... 505/237
See application file for complete search history.

(56) References Cited

U.S. PATENT DOCUMENTS

2002/0180006 A1    12/2002  Franz et al.
2009/0163656 A1 *   6/2009  DeLuca ................. C08G 77/58
                                                  524/837

FOREIGN PATENT DOCUMENTS

FR        2 954 855 A1    7/2001
JP        H06169112 A1    6/1994

OTHER PUBLICATIONS

Arnaud Crassous et al., "Nanoscale Electrostatic Manipulation of Magnetic Flux Quanta in Ferroelectric/Superconductor BiFeO3/YBa2Cu3O7-δ Heterostructures," Physical Review Letters, 107, pp. 247002-1-247002-5 (2011).

*Primary Examiner* — Paul Wartalowicz
(74) *Attorney, Agent, or Firm* — Baker & Hostetler LLP

(57) ABSTRACT

An electrically adjustable memory effect resistor comprises a stack comprising a superconductive material extending along an axis, a ferroelectric material and a conductive third material. The adjustable resistor comprises a means for controlling electrical voltage allowing an electric field to be generated between the superconductive material and the conductive material allowing the polarization direction of the ferroelectric second material to be modified. The adjustable resistor furthermore comprises an electrically insulating material placed between the ferroelectric material and the conductive material, the thickness of the insulating material varying in a direction parallel to the axis—so as to cause a variation in the electric field applied between the first layer and the third layer.

6 Claims, 5 Drawing Sheets

(51) Int. Cl.
*G11C 11/54* (2006.01)
*G11C 11/56* (2006.01)
*G11C 13/00* (2006.01)
*H01L 39/22* (2006.01)
*H01L 45/00* (2006.01)
*H01L 39/12* (2006.01)

(52) U.S. Cl.
CPC ........ *G11C 11/5657* (2013.01); *G11C 13/0002* (2013.01); *H01L 39/126* (2013.01); *H01L 39/22* (2013.01); *H01L 45/04* (2013.01); *H01L 45/1233* (2013.01); *H01L 45/1253* (2013.01); *H01L 45/147* (2013.01); *G11C 2213/52* (2013.01)

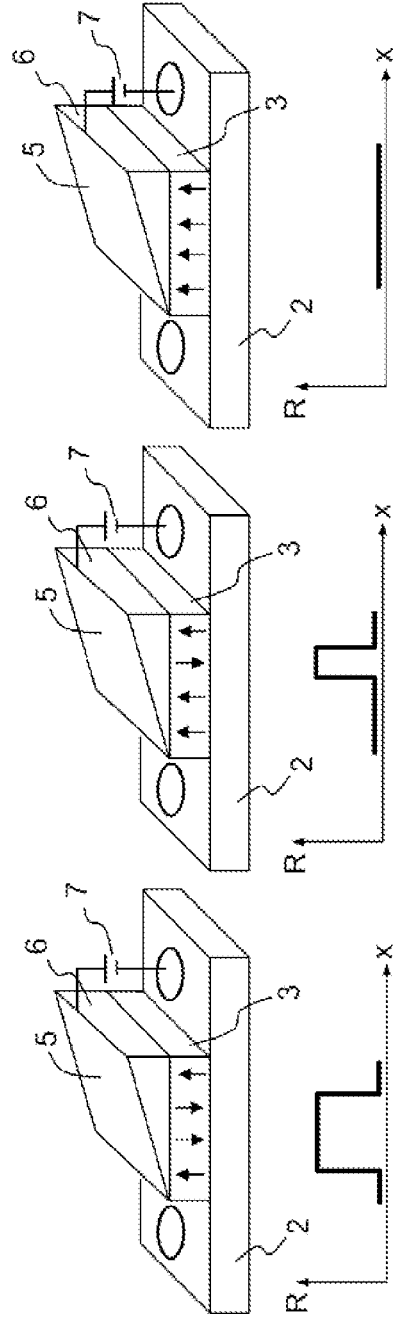

VARISTOR

CROSS-REFERENCE TO RELATED APPLICATIONS

This application is a National Stage of International patent application PCT/EP2013/075840, filed on Dec. 6, 2013, which claims priority to foreign French patent application No. FR 1203321, filed on Dec. 7, 2012, the disclosures of which are incorporated by reference in their entirety.

FIELD OF THE INVENTION

The invention relates to the field of electronic components and notably to resistors. More particularly, the invention relates to electrically adjustable resistors comprising a hybrid structure containing a superconductive material and a ferroelectric material.

The field of application of this type of structure concerns signal limiters or applications in neuromorphic systems.

BACKGROUND

The publication "Nanoscale Electrostatic Manipulation of Magnetic Flux Quanta in Ferroelectric/superconductor $BiFeO_3/YBaCu_3O_7$ Heterostructures" by Crassous et al. Physical Review Letters, 107, 247000 (2011) demonstrates the feasibility of doping a superconductive material of hybrid structure comprising a stack of two layers: a first layer of a superconductive material and a second layer of a ferroelectric material.

The principle of this doping lies in the creation of an electric field in the ferroelectric second material. The ferroelectric second material is polarized or possesses a component of its polarization in a direction parallel to the direction of the stack. The orientation of the electric field of the ferroelectric second material either induces a deficiency of charge carriers in the superconductive first material, the superconductive first material being in an under-doped state relative to the same material in the absence of the ferroelectric second material, or an excess of charge carriers in the superconductive first material, the superconductive first material then being in an over-doped state relative to the same superconductive material in the absence of ferroelectric second material. Doping a superconductive material allows the critical temperature of the superconductive first material to be shifted, the critical temperature of the superconductive first material being the temperature below which the resistance of the superconductive first material is negligible.

The document by Crassous et al. reports a device making it possible, on the one hand, to visualize, using an atomic force microscope (AFM), the polarization direction of the ferroelectric second material after an electrical voltage has been applied between the cantilever and the superconductive first material, the cantilever being a conductive atomic scale tip of the AFM allowing, in this case, a voltage to be applied to the surface of the first material. The resistance of the superconductive film is obtained by measuring the voltage produced by the passage of a current of known value.

The device proposed by the publication of Crassous et al. comprises a hybrid structure, taking the form of a small strip, containing a first layer of superconductive material comprising $YBaCu_3O_7$, denoted YBCO, and a second layer of ferroelectric material comprising $BiFeO_3$, denoted BFO. The BFO, which is a ferroelectric material known for its high remnance, allows "non-volatile" doping of the superconductive first material of the hybrid structure to be achieved. In the present case, the ferroelectric second material has a perovskite structure and is formed, using conditions known to those skilled in the art, in such a way as to allow an accumulation of charge in an amount ranging up to about 100 $\mu C \cdot cm^{-2}$ to be obtained in the (111) direction.

The expression "non-volatile structure" is understood to mean a structure that preserves its properties after application of the electrical voltage has been stopped. In other words, the polarization direction of the ferroelectric second layer remains unchanged after application of the electrical voltage has been stopped. Therefore, the doping state of the superconductive first material remains unchanged after application of the electrical voltage has been stopped.

FIGS. 1a and 1b show a hybrid structure according to the prior art.

FIG. 1a shows the hybrid structure 1 comprising a stack of a superconductive first material 2 and a ferroelectric second material 3 at rest. In other words, no voltage is applied between the cantilever 4 of the AFM and the first layer of superconductive material 2. The polarization of the second layer of ferroelectric material 3 is uniform.

In this case, the polarization of the second layer of ferroelectric material 3 is oriented toward the first layer of superconductive material 2, in other words "downward". The orientation of the polarization of the ferroelectric second material 3 is represented by arrows oriented from top to bottom. According to the measurements published by Crassous et al., if a voltage of −4.5 V is applied between the cantilever 4 of the AFM and the first layer of superconductive material 2, the polarization direction of the second layer of ferroelectric material 3 remains unchanged, the polarization of the second material 3 remaining uniform and oriented from top to bottom. Continuously increasing the voltage applied up to a value below 3 V does not modify the orientation of the polarization, the latter remaining uniform over the entirety of the second layer of ferroelectric material 3.

FIG. 1b shows the hybrid structure 1; an electrical voltage is applied between the cantilever 4 of the AFM and the first layer of superconductive material 2, the applied voltage being 3 V or more. The orientation of the polarization of the second layer of material 3 is locally inverted. The local inversion of polarization is represented by an arrow oriented from bottom to top located beneath the cantilever 4 of the AFM. The polarization direction is locally oriented from bottom to top, generating locally an excess of charge carriers in the superconductive first material 2 enabling its over-doping. The local polarization of the second layer of material 3 will remain in this new state oriented from bottom to top even if the electrical voltage between the cantilever 4 of the AFM and the first layer of superconductive material 2 drops to zero.

The polarization direction of the second layer of ferroelectric material 3 may once more be locally inverted by applying a voltage lower than −3 V between the cantilever 4 of the AFM and the first layer of superconductive material 2.

FIGS. 1a and 1b clearly show a change of polarization direction obtained for a DC electrical voltage value higher in absolute value than a threshold electrical voltage value Us—in the present case the threshold electrical voltage Us is equal to 3 V.

FIG. 2 shows the hysteresis cycle of the ferroelectric second material 3 containing BFO.

This graphical representation was produced using a hybrid structure 1 such as described above. This figure again demonstrates the existence of a threshold electrical voltage Us above which, in absolute value, the orientation of the polarization of the ferroelectric second material 3 is inverted. This threshold voltage value Us allows an electric field of strength at least equal to the strength of the inverting electric field Er to be generated. The expression "inverting electric field" is understood to mean the field allowing the orientation of the polarization of the ferroelectric second material 3 to be inverted in the direction parallel to the direction of the stack.

FIG. 3 shows the resistance of a hybrid structure 1 such as described above as a function of temperature and as a function of the doping state of the first layer of superconductive material 2.

To determine the resistance values, an electrical current density of 1.7 kA·cm$^{-2}$ was made to flow through the hybrid structure 1.

First measurements of the electrical voltage as a function of temperature across the terminals of a first zone corresponding to the under-doped state of the superconductive first material 2, and second measurements of the voltage across the terminals of a second zone corresponding to the over-doped state of the superconductive first material 2, were carried out. The resistances as a function of temperature were then deduced from the voltage measurements carried out for the over-doped state and the under-doped state of the first layer of superconductive material 2.

A first curve (the solid line) corresponds to the resistance variation determined for the first superconductive material 2 in the under-doped state as a function of temperature.

In a first temperature range comprised between 0 K and 14 K, the resistance of the superconductive first material 2 is almost zero. In a second temperature range comprised between 14 K and 150 K, the resistance of the superconductive first material 2 substantially increases with temperature. In the under-doped state the superconductive first material 2 thus has a first critical temperature Tc1, the first critical temperature Tc1 being equal to 14 K. Below this first critical temperature Tc1, the resistance of the superconductive first material 2 is negligible.

A second curve (the discontinuous line) corresponds to the resistance variation determined for the superconductive first material 2 in the over-doped state as a function of temperature.

In a third temperature range comprised between 0 and 37 K, the resistance of the superconductive first material 2 is almost zero. In a fourth temperature range comprised between 37 K and 150 K, the resistance substantially increases with temperature. In the doped state, a second critical temperature Tc2 of the superconductive first material 2 is equal to 37 K, below this temperature the resistance of the superconductive first material 2 is negligible.

The curves representing the variation in the resistance of a hybrid structure 1 as a function of temperature for a superconductive first material 2 in the doped state and undoped state are of similar shape. The second critical temperature Tc2, corresponding to the over-doped state of the first superconductive material 2, is above the first critical temperature Tc1, corresponding to the under-doped state of the superconductive first material 2. This difference in the critical temperature of the over-doped state and of the under-doped state of the superconductive first material 2 allows a first temperature interval ΔT1 to be defined in which the difference in the resistance of the over-doped state and of the under-doped state of the superconductive first material 1 is nonzero for a given operating temperature. In the present case, this temperature interval is comprised between 14 K and at least 150 K. The temperature of 150 K was the highest for which measurements were taken in the experiments shown in FIG. 3. However, a nonzero difference in resistance is achieved for any temperature above the first critical temperature Tc1. The largest difference in resistance is observed in the temperature interval comprised between Tc1 and Tc2.

Therefore, changing the state of the superconductive first material 2 in the temperature interval above 14K allows the resistance of the hybrid structure 1 to be altered.

FIG. 4 shows a first application of a hybrid structure 1 according to the prior art.

The hybrid structure 1 comprises the stack of the first layer of superconductive material 2, the second layer of the ferroelectric material 3 and an upper electrode or gate comprising a conductive material 5. A DC electrical voltage is applied between the conductive electrode 5 and the superconductive first material 2. Applying a positive or negative voltage makes it possible to achieve, under the upper gate, a local nonvolatile change in the polarization direction of the second layer of ferroelectric material 3, the change in the polarization direction being reversible by simply applying an electrical voltage of opposite value. The change in polarization direction engenders a change in the state of the superconductive first material 2, which will then pass from an under-doped state to an over-doped state, or vice versa. For a given operating temperature comprised in the first temperature interval ΔT1, the change of state of the superconductive first material 2 from an under-doped state to an over-doped state induces a decrease in the resistance of the superconductive material. In contrast, changing the state of the superconductive first material 2 from an over-doped state to an under-doped state induces an increase in the resistance of the superconductive first material 2.

This device allows, in a "switching" mode, one resistance value to be switched to another. By optimizing the choice of the operating temperature, this device allows, in the "switching" mode, current to flow or be blocked. The device proposed in the prior art does not allow the resistance to be gradually varied.

SUMMARY OF THE INVENTION

The device proposed according to the invention allows an electrically controllable memory effect varistor to be produced.

According to one aspect of the invention, provision is made for an electrically adjustable memory effect resistor comprising:

a stack comprising:
a first layer of a superconductive first material possessing a first under-doped state of first critical temperature and a second over-doped state of second critical temperature, the second critical temperature being above the first critical temperature, the first layer extending along an axis x;
a second layer of a ferroelectric second material polarized or having a component of its polarization in a direction parallel to the direction of the stack, the state of the first material depending on the polarization direction of the second material; and
a third layer of a conductive third material; and
a means for controlling the electrical voltage between the first and the third layer, generating an electric field allowing the polarization direction of the second material to be modified when the electrical control voltage is higher than a threshold electrical voltage and generates an electric field at the surface of the ferroelectric second material higher than the inverting field.

The stack furthermore comprises a fourth layer of at least one electrically insulating fourth material, the fourth layer being placed between the second layer and the third layer, the thickness of the fourth layer varying in a direction parallel to the axis x and/or the fourth layer comprises a succession of materials along the axis x having different dielectric constants so as to cause a variation in the electric field applied between the third layer of the conductive third material and the first layer of the superconductive first material, the adjustable resistor being configured to operate over an interval of temperatures in which the difference between the electrical resistance of the over-doped state and the under-doped state of the first material is nonzero.

The device thus produced allows the electrical resistance of the first layer of superconductive material to be varied depending on the voltage applied between the first layer of superconductive material and the third layer of conductive material. The device moreover preserves the last resistance value setting after application of the electrical voltage has been stopped.

Preferably, the thickness of the fourth layer continuously increases in a direction parallel to the direction of the axis x, this making continuous variation in the value of the resistance possible.

Advantageously, the first material is a superconductor with a high critical temperature, the associated cooling systems being small in size and requiring little power.

Advantageously, the superconductive first material is $YBa_2Cu_3O_7$, or $NdBa_2Cu_3O_{7-x}$ or any other superconductive material from the $ReBa_2CuO_{7-x}$ family, Re being a material from the rare-earth family; or any other superconductive material from the cuprate family.

Advantageously, the ferroelectric second material preserves the polarization direction defined by applying the electrical voltage after application of the electrical voltage has been stopped; typically the ferroelectric second material is $BiFeO_3$ or $BaTiO_3$.

BRIEF DESCRIPTION OF THE DRAWINGS

The invention will be better understood on studying a few embodiments, described by way of completely nonlimiting example, illustrated by the appended drawings in which:

FIGS. 6a to 6f show a preferred embodiment of the adjustable resistor, according to one aspect of the invention.

DETAILED DESCRIPTION

Figure 1A:
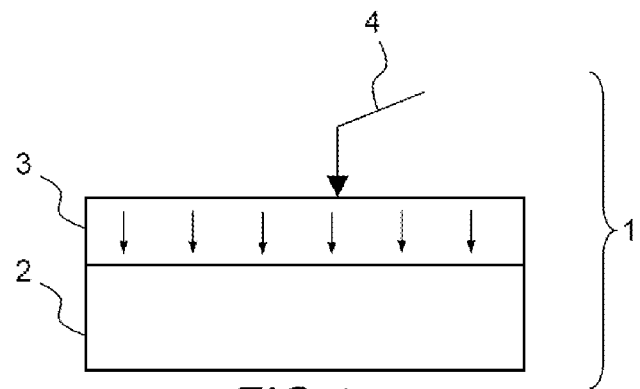
FIGS. 1a and 1b, described above, illustrate a device allowing the doping of a superconductive material comprised in a hybrid structure to be observed, according to the prior art.
Figure 1B:
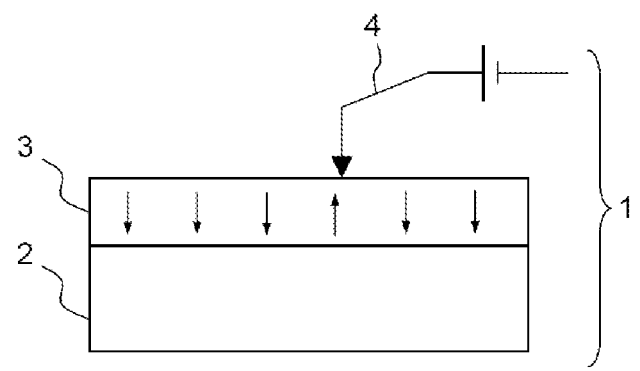
Figure 2:
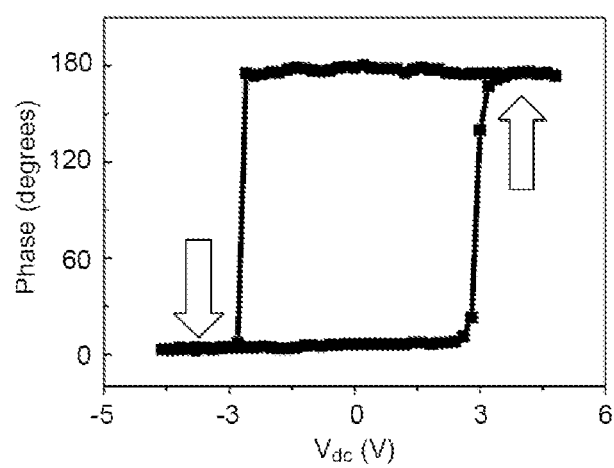
FIG. 2 shows the hysteresis cycle of BFO, according to the prior art.
Figure 3:
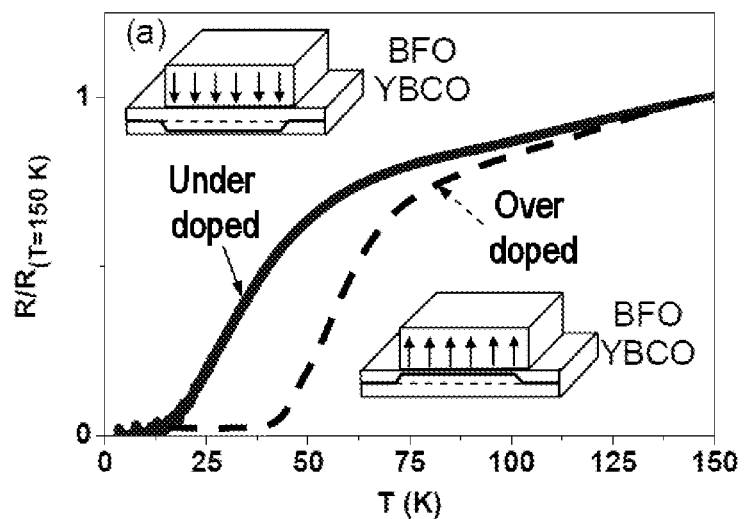
FIG. 3, described above, shows the variation in the resistance of a hybrid BFO/YBCO structure as a function of temperature for the over-doped and under-doped states of the superconductive first material YBCO, according to the prior art.
Figure 4:
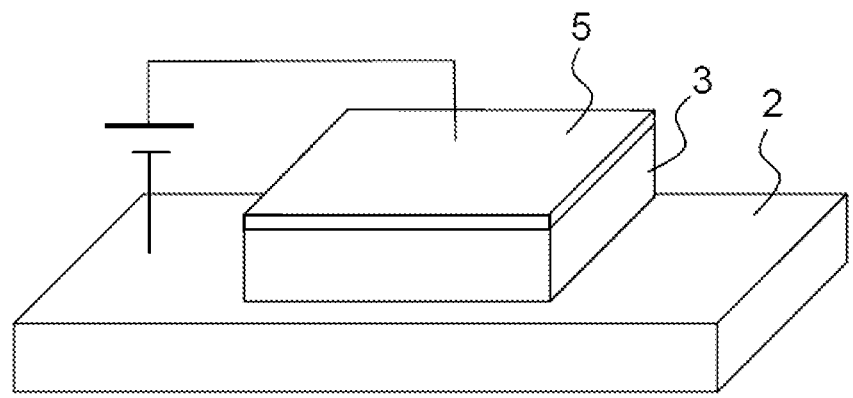
FIG. 4, described above, shows a first application of the hybrid structure, according to the prior art.
Figure 5A:
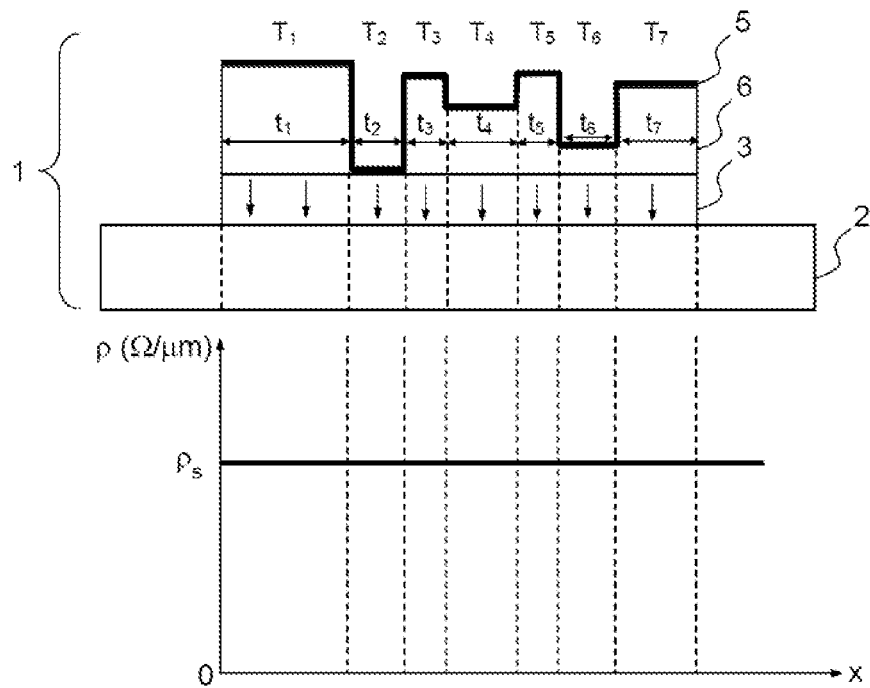
FIGS. 5a to 5c show one embodiment of the adjustable resistor, according to one aspect of the invention.
Figure 5B:
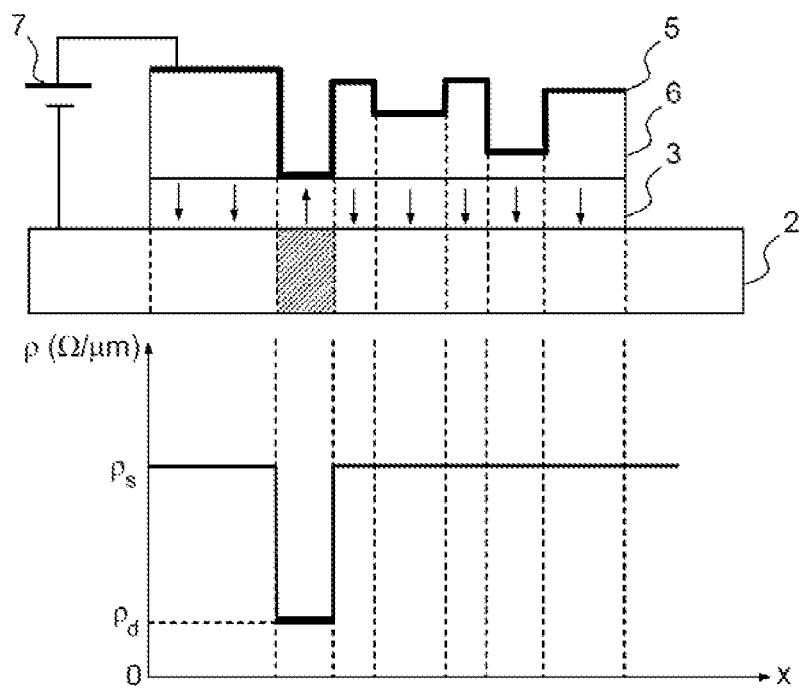
Figure 5C:
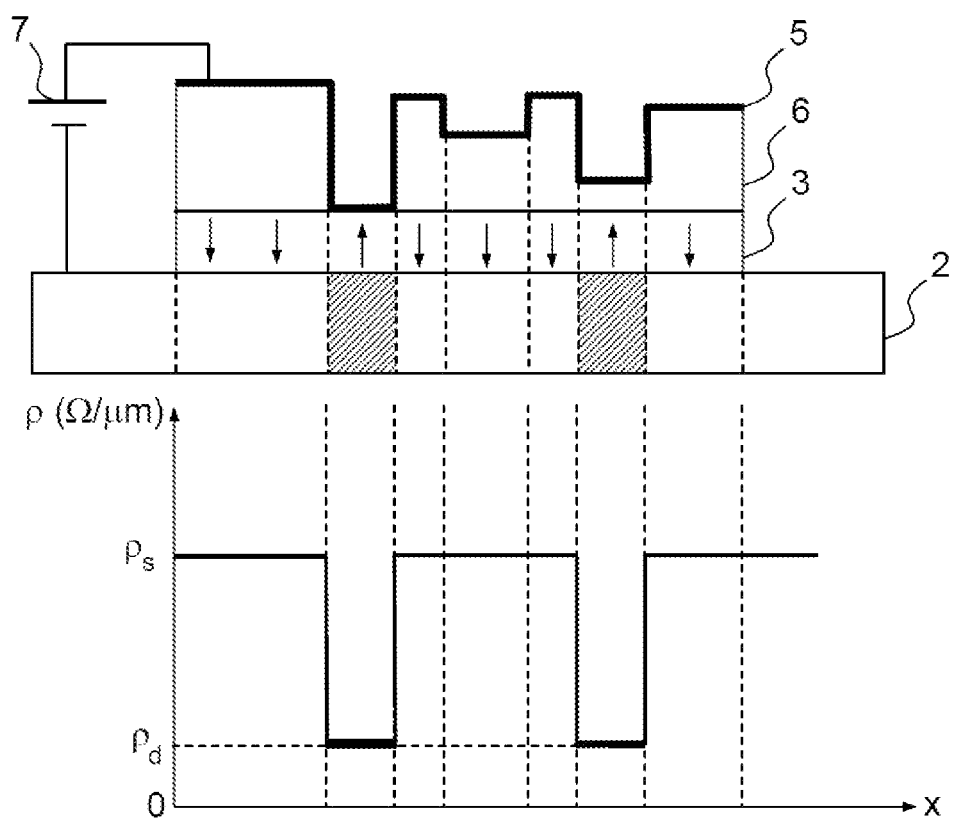

FIGS. 5a to 5c show one embodiment of the adjustable resistor.

The adjustable resistor comprises a hybrid structure 1 including a first layer of superconductive material 2, a second layer of ferroelectric material 3, a third layer of conductive material 5 and a fourth layer of electrically insulating material 6 placed between the second and third layers 3 and 5.

The first layer of superconductive material 2 advantageously comprises a superconductive material of high critical temperature such as YBCO. The superconductive material 2 of high critical temperature may be associated with a small, low-power cooling system. The first layer of the superconductive first material 2 extends over a length along an axis x.

The second layer of ferroelectric material 3 is placed on the first layer of superconductive material 2. Preferably, the ferroelectric second material 3 possesses a high remnant polarization allowing a nonvolatile structure to be produced.

The fourth layer of electrically insulating material 6 is placed on the second layer of the ferroelectric material 3, the thickness of the insulating fourth layer 6 varying so as to obtain, for a given voltage applied to the third layer of conductive material 5, various electric field values in the second layer of the ferroelectric material 3.

In the present case, the variation in thickness is obtained by cutting into the top side of the fourth layer of material so as to define a succession of sections, denoted Ti, of length ti, in the hybrid structure 1, along the axis x.

In one variant of the invention, it is possible to produce the sections Ti using insulating materials of different dielectric constants.

A third layer of electrically conductive material 5 is placed on the top side of the fourth layer of insulating material 6. The third layer of conductive material 5 allows an electrical voltage to be applied between the first layer of superconductive material 2 and the third layer of conductive material 5.

The operating temperature Tf is above the first critical temperature TC1. Preferably, the operating temperature Tf corresponds to a temperature for which the difference between the resistance of the first superconductive material 2 in the over-doped and under-doped states is maximal, notably a temperature in the first temperature interval $\Delta T1$.

FIG. 5a shows the adjustable resistor such as described above at rest, or, in other words, when the polarization direction is oriented from top to bottom in all the sections Ti of the hybrid structure 1, the polarization direction of the ferroelectric second material 3 being represented by the arrows, no electrical voltage being applied between the fourth layer of conductive material 5 and the first layer of superconductive material 2. The orientation from top to bottom of the polarization engenders a deficit of charge carriers in the first layer of superconductive material 2; in all the zones located facing the sections Ti the superconductive material 2 is in the under-doped state.

The elementary resistances Ri of the N sections Ti are equal to $\rho_s \cdot t_i$, $\rho_s$ being the value of the resistance per unit length of the layer of superconductive material in the under-doped state and ti being a dimension of a section Ti along the axis x. Since the elementary resistances Ri of the N sections may be likened to resistors in series, the total resistance $R_T$ of the superconductive first material 2 is equal to the sum of the N elementary resistances Ri of the various sections Ti. In this case, the total resistance $R_T$ of the superconductive material 2 is equal to $$\rho_s \sum_{i=1}^{N} t_i.$$

FIG. 5b shows the adjustable resistor when a first electrical voltage U1 is applied using a control means 7. The first applied voltage U1 is equal to the threshold electrical voltage Us, the threshold electrical voltage Us being the voltage required to generate an electric field of strength equal to the strength of the inverting electric field Er of the polarization in the absence of the fourth layer of electrically insulating material 6. Because of the various thicknesses of the insulating fourth material 6, the electric fields applied to the ferroelectric second material 3 in the various sections Ti are different.

Since the electrically insulating fourth material 6 corresponding to the first section T1 is relatively thick, the voltage U1 applied between the third layer of conductive material 5 and the first layer of superconductive material 2 produces an electric field in the ferroelectric second material 3 in the section T1 lower than the inverting electric field Er. Therefore, the polarization direction of the ferroelectric second material 3 corresponding to the first section T1 is not modified.

For identical reasons, the polarization direction of the ferroelectric second material 3 corresponding to the sections T3 to T7 is not modified.

Since the thickness of the insulating fourth material 6 corresponding to the second section T2 is zero, and since the voltage U1 applied between the third layer of conductive material 5 and the first layer of superconductive material 2 is equal to the voltage Us, the electric field in the section T2 of the ferroelectric second material 3 is thus equal to the inverting electric field Er. The polarization direction of the ferroelectric second material 3 corresponding to the second section T2 is therefore inverted. The inverted orientation of the ferroelectric second material 3 is represented by an arrow oriented from bottom to top in FIG. 5b. The orientation of the polarization of the ferroelectric second material in the second section T2 engenders an excess of charge carriers in the first layer of superconductive material 2 in the second section T2. The first superconductive material 2 is in the over-doped state and has a resistance per unit length $\rho d$, represented by a hatched zone in FIG. 5b. The resistance per unit length in the over-doped state $\rho d$ is lower than the resistance per unit length in the over-doped state $\rho s$. In particular, $\rho d$ is zero if the device is used at a temperature comprised in the temperature interval comprised between Tc1 and Tc2. The total resistance $R_T$ in the general case is equal to $$\left( \sum_{i=1}^{N} \rho_s(t_i - t_2) + \rho_d t_2 \right).$$

Since the ferroelectric second material 3 used has a high remnant polarization, the orientation of the polarization of the ferroelectric second material 3 in the N sections Ti remains unchanged after application of the voltage U1 has been stopped, and, thus, the total resistance $R_T$ then remains equal to $$\left( \sum_{i=1}^{N} \rho_s(t_i - t_2) + \rho_d t_2 \right)$$

after application of the voltage U1 has been stopped.

FIG. 5c shows the adjustable resistor during application of a second voltage U2, the second voltage U2 being higher than the threshold electrical voltage Us. Since the thickness of the fourth layer of insulating material 6 corresponding to the sixth section T6 is relatively small, the voltage applied between the third layer of conductive material 5 and the first layer of superconductive material 2 produces an electric field at least equal to the inverting electric field Er in the sixth section T6. The polarization direction of the ferroelectric second material 3 corresponding to the sixth section T6 is inverted. The total resistance $R_T$ is then equal to $$\left( \sum_{i=1}^{N} \rho_s(t_i - t_2 - t_6) + \rho_d(t_2 + t_6) \right).$$

Application of a third voltage U3 of absolute value equal to U2 but of opposite sign will produce an electric field that is strong enough to ensure the inversion of the polarization in sections T2 and T6 of the ferroelectric second material 3, thereby returning the resistor to the state in FIG. 5a.

FIGS. 5a to 5c illustrate one embodiment of the adjustable resistor and demonstrate that it is possible to vary the value of the total resistance using an electrical control.

FIGS. 6a to 6f show one preferred embodiment of the adjustable resistor, according to one aspect of the invention.

The adjustable resistor comprises a hybrid structure including a superconductive first layer 2 of YBCO, a ferroelectric second layer 3 of BFO, a conductive third layer 5 of gold, and a fourth layer of insulating material, which layer is placed between the second and third layers. The fourth layer of material forms a ramp in a direction parallel to the axis x, thus allowing the resistance of the resistor to be finely adjusted.

To give orders of magnitude for the size of the hybrid structure, the ferroelectric second layer 3 of BFO may have a thickness of 30 nm. The superconductive first layer 2 of YBCO may have a thickness corresponding to 3 crystalline unit cells. The width along the axis y of the hybrid structure may be equal to 10 µm.

In this embodiment, a threshold electrical voltage Us equal to 3 V or −3 V allows the orientation of the polarization of the ferroelectric second layer 3 of BFO to be changed when the latter makes direct contact with the conductive third layer 5 of gold.

The resistance determined for a hybrid structure 1 such as described having a YBCO first layer in the under-doped state and a length along the axis x of 10 µm is about 2000 ohms.

FIG. 6a shows the hybrid structure at rest; the ferroelectric first layer 3 of BFO is in the over-doped state and the resistance is negligible over the entirety of the superconductive first layer 2 of YBCO, as indicated by the curve representing the elementary resistance Ri along the axis x. Since the total resistance $R_T$ of the hybrid structure 1 is the sum of the elementary resistances Ri, in this case the total resistance of the hybrid structure 1 is zero.

FIG. 6b shows the hybrid structure when a negative voltage substantially higher than the threshold voltage Us is applied, this voltage generating in the ferroelectric layer 3 an inverting electric field Er of the polarization. In a first portion of the hybrid structure 1, the voltage applied between the conductive third layer 5 of gold and the superconductive first layer 2 of YBCO inverts the polarization of the ferroelectric layer 3, the first portion corresponding to a zone in which the fourth layer of insulating material 6 has a very small thickness. The YBCO first layer corresponding to this first portion will then pass from the over-doped state to the under-doped state. The resistance of the first portion of the YBCO first layer 2 is then equal to a resistance Ri. The first total resistance $R_{T1}$ then becomes nonzero.

By gradually increasing the absolute value of the negative voltage applied between the superconductive first layer 2 of YBCO and the conductive third layer 5 of gold, a second portion of the superconductive layer 2 passes into the under-doped state, as indicated in FIG. 6c. The second zone includes the first zone. It is thus possible to create a second resistance $R_{T2}$, the second total resistance $R_{T2}$ of the conductive first layer 2 of YBCO being higher than the first total resistance $R_{T1}$.

FIG. 6d shows the hybrid structure 1 when a positive voltage substantially higher than the threshold voltage Us is applied to the hybrid structure 1 such as shown in FIG. 6c. In the first portion of the hybrid structure 1, the voltage applied between the conductive third layer 5 of gold and the superconductive first layer 2 of YBCO will produce an electric field higher than or equal to the inverting field of the polarization of the ferroelectric layer 3. The first layer 2 of YBCO corresponding to this first portion will pass from the under-doped state to the over-doped state. The resistance of the first portion of the YBCO first layer 2 is then zero. It is thus possible to create a third resistance $R_{T3}$, the third total resistance $R_{T3}$ of the superconductive first layer 2 of YBCO being lower than the second total resistance $R_{T2}$.

By increasing the voltage applied between the superconductive first layer 2 of YBCO and the conductive third layer 5 of gold of the hybrid structure such as shown in FIG. 5d, a third portion of the superconductive layer 2 passes into the over-doped state, as indicated in FIG. 6e. The third portion includes the first portion. It is thus possible to create a fourth resistance $R_{T4}$, the fourth total resistance $R_{T4}$ of the conductive first layer 2 of YBCO being lower than the third total resistance $R_{T3}$.

If the YBCO first layer of superconductive material 2 is in the over-doped state at rest, applying a negative voltage, higher than the threshold voltage Us and increasingly large in absolute value will allow the value of the total resistance to be gradually increased until a maximum total resistance value is achieved. Then, applying an increasingly large positive voltage higher than the threshold voltage Us will allow the value of the total resistance to be gradually decreased until a zero total resistance value is achieved.

The proposed device allows an electrically controllable varistor to be produced, the resistance preserving its value even after application of the electrical control voltage has been stopped.

The invention claimed is:

1. An electrically adjustable memory effect resistor comprising:
    a stack comprising:
        a first layer of a superconductive first material possessing a first under-doped state of first critical temperature and a second over-doped state of second critical temperature, the second critical temperature being above the first critical temperature, the first layer of superconductive material extending along an axis;
        a second layer of a ferroelectric second material polarized or having a component of its polarization in a direction parallel to the direction of the stack, the state of the first material depending on the polarization direction of the second material; and
        a third layer of a conductive third material; and
    a means for controlling the electrical voltage between the first layer of superconductive material and the third layer of conductive material, generating an electric field allowing the polarization direction of the ferroelectric second material to be modified when the electrical control voltage is higher than a threshold voltage value;
    the stack further comprises a fourth layer comprising at least one electrically insulating fourth material, the fourth layer being placed between the second layer of ferroelectric material and the third layer of conductive material, the thickness of the electrically insulating fourth layer varying in a direction parallel to the axis x and/or the fourth layer comprises a succession of materials of different dielectric constants in a direction parallel to the axis, so as to cause a variation in the electric field applied between the first layer and the third layer, the adjustable resistor being configured to operate over an interval of temperatures in which the difference between the electrical resistance of the over-doped state and the under-doped state of the first material is nonzero.

2. The adjustable resistor as claimed in claim 1, in which the first material is a superconductor with a high critical temperature.

3. The adjustable resistor as claimed in claim 2, in which the superconductive first material comprises $YBa_2Cu_3O_{7-x}$, or $NdBa_2Cu_3O_{7-x}$ or any other superconductive material from the $ReBa_2CuO_{7-x}$ family, Re being a material from the rare-earth family; or any other superconductive material from the cuprate family.

4. The adjustable resistor as claimed in claim 1, in which the ferroelectric second material preserves the polarization direction defined by applying the electrical voltage after application of the electrical voltage has been stopped.

5. The adjustable resistor as claimed in claim 4, in which the second material comprises $BiFeO_3$ or $BaTiO_3$.

6. The adjustable resistor as claimed in claim 1, in which the thickness of the electrically insulating fourth layer continuously increases in a direction parallel to the axis.

* * * * *